US012610642B2

(12) United States Patent
Yoshida

(10) Patent No.: US 12,610,642 B2
(45) Date of Patent: Apr. 21, 2026

(54) PHOTOELECTRIC CONVERSION APPARATUS, SUBSTRATE, MANUFACTURING METHOD, AND EQUIPMENT

(71) Applicant: CANON KABUSHIKI KAISHA, Tokyo (JP)

(72) Inventor: Ryo Yoshida, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 497 days.

(21) Appl. No.: 18/180,738

(22) Filed: Mar. 8, 2023

(65) Prior Publication Data

US 2023/0290799 A1 Sep. 14, 2023

(30) Foreign Application Priority Data

Mar. 11, 2022 (JP) ................................. 2022-038231
Jan. 30, 2023 (JP) ................................. 2023-012107

(51) Int. Cl.
*H10F 39/00* (2025.01)
*H10F 39/12* (2025.01)

(52) U.S. Cl.
CPC ....... *H10F 39/8057* (2025.01); *H10F 39/011* (2025.01); *H10F 39/199* (2025.01); *H10F 39/8053* (2025.01); *H10F 39/8063* (2025.01)

(58) Field of Classification Search
CPC ........................... H10F 39/807; H10F 39/8057
See application file for complete search history.

(56) References Cited

U.S. PATENT DOCUMENTS

| 8,674,283 | B2 * | 3/2014 | Roy ..................... H10F 39/803 |
| | | | 257/446 |
| 10,937,821 | B2 * | 3/2021 | Jung ..................... H10F 39/024 |
| 10,991,741 | B2 * | 4/2021 | Tanaka .................. H10F 39/199 |
| 11,069,732 | B2 * | 7/2021 | Ukigaya ............... H01L 23/481 |
| 11,742,372 | B2 * | 8/2023 | Ukigaya ............. H10F 39/8057 |
| | | | 257/446 |
| 11,990,490 | B2 * | 5/2024 | Tange ................. H10F 39/8057 |
| 12,119,364 | B2 * | 10/2024 | Chen ..................... H10F 39/811 |

(Continued)

FOREIGN PATENT DOCUMENTS

| EP | 3525239 A1 * | 8/2019 | ........... H10F 77/334 |
| JP | 2013128036 A | 6/2013 | |

(Continued)

*Primary Examiner* — Mounir S Amer
*Assistant Examiner* — Alexander Belousov
(74) *Attorney, Agent, or Firm* — Canon U.S.A., Inc., IP Division

(57) ABSTRACT

A photoelectric conversion apparatus includes a semiconductor layer including a front surface, a back surface, and a plurality of photoelectric conversion portions, a first insulation film on a back surface side of the semiconductor layer, a light shielding film between the first insulation film and the back surface, a first light shielding wall in the first insulation film, and a second light shielding wall in the first insulation film, wherein an end portion of the first light shielding wall that is on the back surface side is in contact with the light shielding film, and wherein a distance between an end portion of the light shielding film that is on the back surface side and the back surface is greater than a distance between an end portion of the second light shielding wall that is on the back surface side and the back surface.

15 Claims, 8 Drawing Sheets

(56)                    References Cited

U.S. PATENT DOCUMENTS

| | | | |
|---|---|---|---|
| 12,191,335 B2 * | 1/2025 | Park | H10F 39/8063 |
| 12,266,668 B2 * | 4/2025 | Chang | H10F 39/8063 |
| 12,356,746 B2 * | 7/2025 | Togo | H10F 39/811 |
| 2015/0372031 A1 * | 12/2015 | Yoon, | H10F 39/024 |
| | | | 257/446 |
| 2017/0213860 A1 * | 7/2017 | Ukigaya | H10F 39/8053 |
| 2019/0229141 A1 * | 7/2019 | Kim | H10F 39/807 |
| 2020/0083263 A1 * | 3/2020 | Tanaka | H10F 39/802 |
| 2021/0313369 A1 * | 10/2021 | Tange | H10F 39/8063 |
| 2021/0327939 A1 * | 10/2021 | Togo | H10F 39/811 |
| 2021/0335863 A1 * | 10/2021 | Ukigaya | H10F 39/026 |
| 2023/0290799 A1 * | 9/2023 | Yoshida | H10F 39/8057 |

FOREIGN PATENT DOCUMENTS

| | | | |
|---|---|---|---|
| JP | 2017224741 A | 12/2017 |
| JP | 2021027276 A | 2/2021 |
| JP | 2021170585 A | 10/2021 |

* cited by examiner

FIG.4A
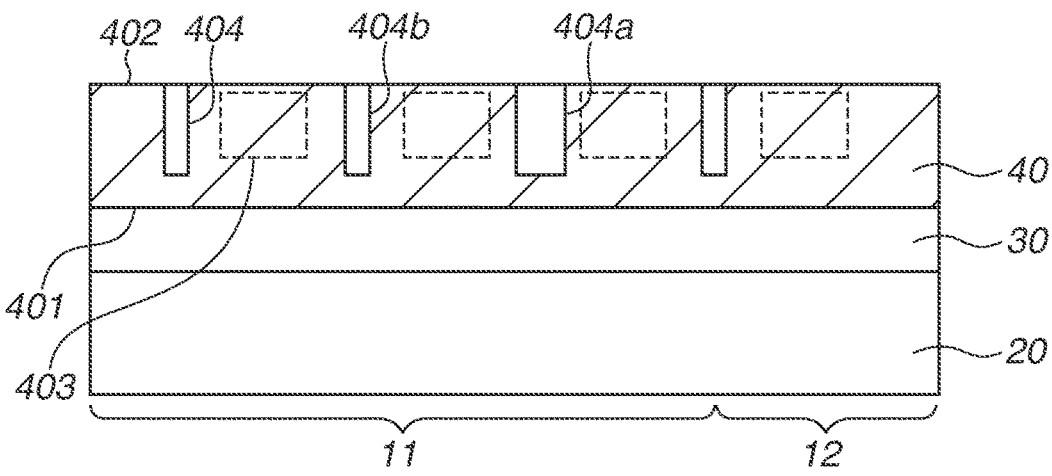
FIG.4B
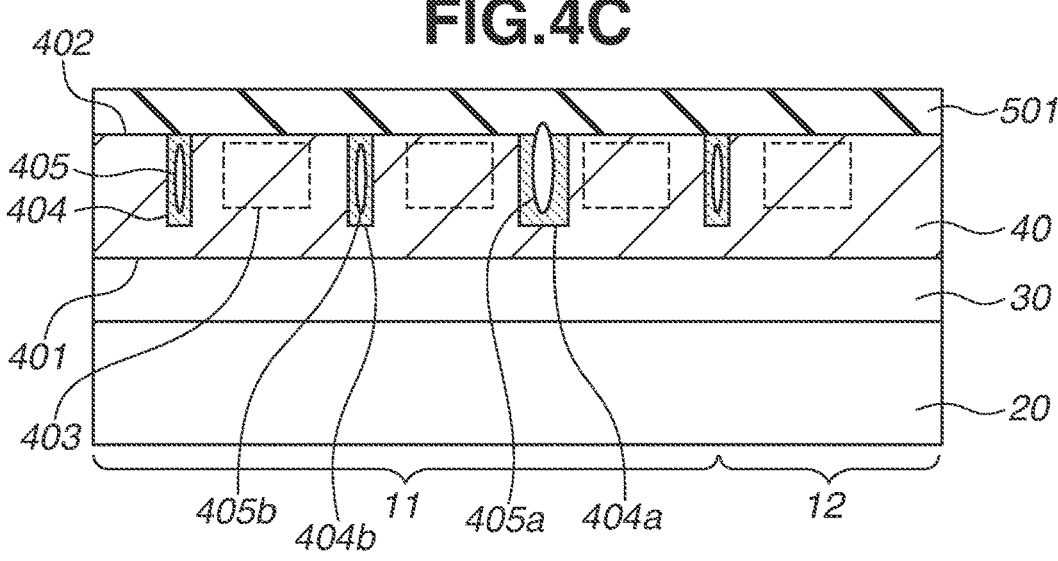
FIG.4C

PHOTOELECTRIC CONVERSION APPARATUS, SUBSTRATE, MANUFACTURING METHOD, AND EQUIPMENT

BACKGROUND

Field of the Disclosure

The present disclosure relates to a photoelectric conversion apparatus, a substrate, a method for manufacturing the photoelectric conversion apparatus, a method for manufacturing the substrate, and equipment.

Description of the Related Art

A back-side illumination type photoelectric conversion apparatus includes a groove-shaped separation portion on a back surface side of a semiconductor layer and a light shielding member on the back surface of the semiconductor layer to reduce crosstalk between pixels. Japanese Patent Application Laid-Open No. 2021-170585 discusses a structure of a back-side illumination type photoelectric conversion apparatus that includes a groove-shaped separation portion on a back surface side of a semiconductor layer and a light shielding wall and a light shielding film on the back surface of the semiconductor layer, and a distance between a lower end of the light shielding wall and the separation portion is smaller than a distance between a lower end of the light shielding film and the separation portion.

In order to reduce crosstalk between neighboring pixels in the back-side illumination type photoelectric conversion apparatus, the distance between the groove-shaped separation portion on the back surface side of the semiconductor layer and the light shielding wall on the back surface of the semiconductor layer is to be small. However, the separation portion can include a space formed in embedding an insulation film in a groove, and in a case where the lower end of the light shielding wall is too close to the separation portion, the space in the separation portion may be exposed in manufacturing the photoelectric conversion apparatus. This may affect contamination of a manufacturing apparatus in manufacturing a photoelectric conversion apparatus and is thus undesirable. Japanese Patent Application Laid-Open No. 2021-170585 discusses a structure in which the lower end of the light shielding wall over the separation portion is close to the separation portion. With the structure, since the distance between the separation portion and the light shielding wall is small, crosstalk is effectively reduced. However, the lower end of the light shielding wall and the space in the separation portion may come into contact with each other.

SUMMARY

The present disclosure is directed to a photoelectric conversion apparatus with reduced crosstalk and reduced contamination in a manufacturing process.

According to an aspect of the present disclosure, a photoelectric conversion apparatus includes a semiconductor layer including a front surface, a back surface, and a plurality of photoelectric conversion portions between the front surface and the back surface, a wiring structure on the front surface side of the semiconductor layer, a first insulation film on a back surface side of the semiconductor layer, a light shielding film between the first insulation film and the back surface, a first separation portion between two of the plurality of photoelectric conversion portions, a second separation portion between another two of the plurality of photoelectric conversion portions, the second separation portion being smaller in width in a first direction, parallel to the back surface, than the first separation portion, a first space in the first separation portion, a first light shielding wall in the first insulation film, the first light shielding wall overlapping the first separation portion in plan view from the back surface side, and a second light shielding wall in the first insulation film, the second light shielding wall overlapping the second separation portion in plan view from the back surface side. An end portion of the first light shielding wall that is on the back surface side is in contact with the light shielding film, and a distance between an end portion of the light shielding film that is on the back surface side and the back surface is greater than a distance between an end portion of the second light shielding wall that is on the back surface side and the back surface.

Further features of the present disclosure will become apparent from the following description of embodiments with reference to the attached drawings.

BRIEF DESCRIPTION OF THE DRAWINGS

FIGS. 4A, 4B, and 4C are schematic diagrams illustrating a method for manufacturing the photoelectric conversion apparatus illustrated in FIGS. 3A and 3B.

DESCRIPTION OF THE EMBODIMENTS

Figure 1A:
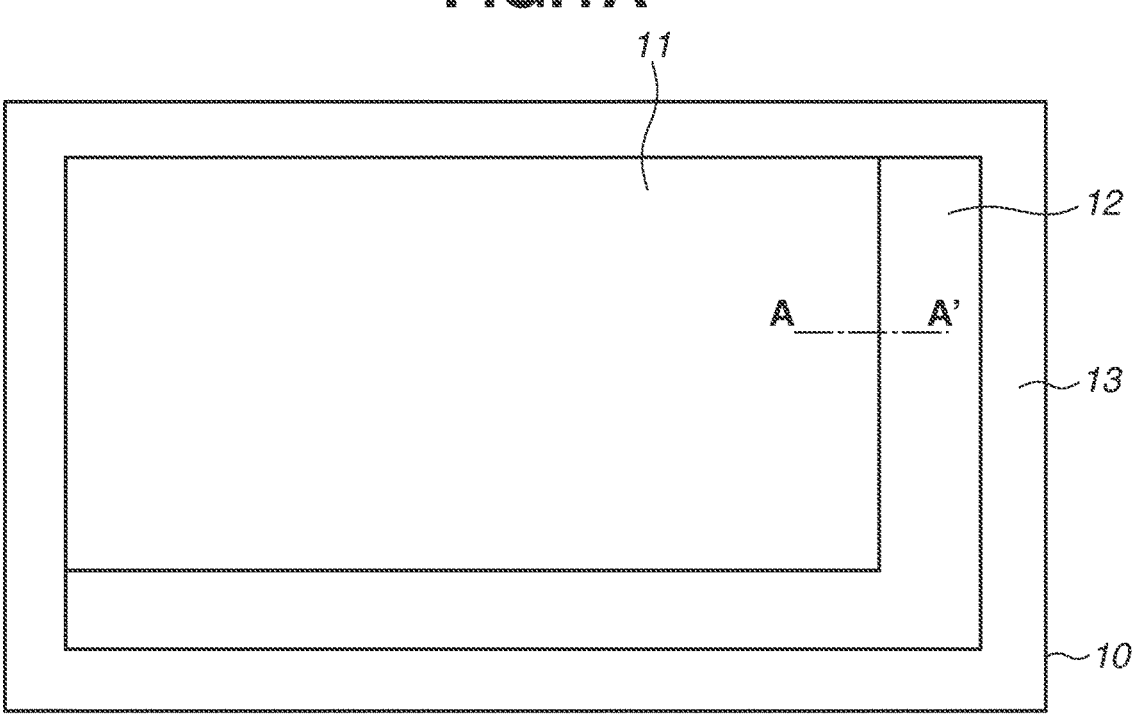
FIGS. 1A and 1B are schematic diagrams illustrating a configuration of a photoelectric conversion apparatus.

Various embodiments will be described in detail below with reference to the attached drawings. The below-described embodiments are not intended to limit the scope of the claimed disclosure. While a plurality of features is described in the embodiments, not all of the plurality of features are always essential to the present disclosure, and the plurality of features can be combined as needed. Further, components that are identical or similar to each other are given the same reference numeral in the attached drawings, and redundant descriptions thereof are omitted. Further, mainly a complementary metal oxide semiconductor (CMOS) sensor will be described below as an example of a photoelectric conversion apparatus according to the embodiments. It should be noted that the photoelectric conversion apparatus according to the embodiments is not limited to the CMOS sensor and is also applicable to other examples of the photoelectric conversion apparatus. Examples thereof include a charge-coupled device (CCD) sensor, an imaging apparatus, a distance measurement apparatus (an apparatus for measuring a distance using focus detection or time of flight (TOF)), and a photometry apparatus (an apparatus for measuring an amount of incident light).

In the present specification, terms that indicate a specific direction or a specific position are used as needed (e.g., "upper", "lower", "right", "left", and other terms including the foregoing terms). Use of the terms is intended to facilitate understanding of the embodiments with reference to the drawings, and the technical scope of the present disclosure is not to be limited by the meanings of the terms.

In the present specification, the term "flat surface" refers to a surface in a direction parallel to a main surface of a substrate. The main surface of the substrate can be a light incident surface of the substrate including a photoelectric conversion element, a surface with a plurality of analog/ digital conversion circuits (ADC) arranged repeatedly, or a bonding surface of substrates of a layered photoelectric conversion apparatus. Further, the term "in plan view" refers to a view from a direction vertical to the main surface of the substrate. Further, the term "cross section" refers to a surface in the direction vertical to the main surface of the substrate. Further, the term "cross-sectional view" refers to a view from the direction parallel to the main surface of the substrate.

FIG. 1A is a schematic diagram illustrating a back-side illumination type photoelectric conversion apparatus 10. The photoelectric conversion apparatus 10 includes a light receiving pixel region 11, a light shielding pixel region 12, and a peripheral region 13. Unit pixels including photoelectric conversion elements are two-dimensionally arrayed in m rows and n columns on the light receiving pixel region 11 and the light shielding pixel region 12.

Figure 2:
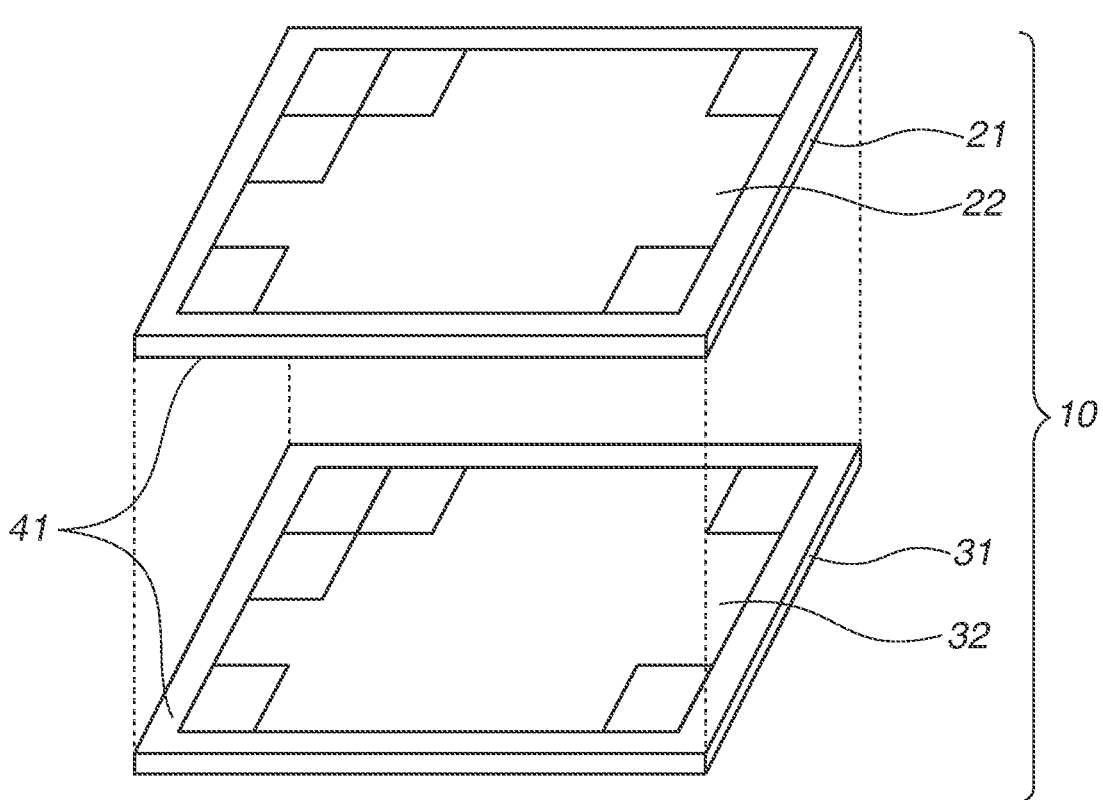
FIG. 2 is a schematic diagram illustrating a configuration of a photoelectric conversion apparatus.

The peripheral region 13 is provided with a circuit element, a pad for external connection, or an opening for the pad as needed. As illustrated in FIG. 2, the back-side illumination type photoelectric conversion apparatus 10 with a sensor substrate 21 and a circuit substrate 31 each having a bonding surface 41 can have a layered structure in which the bonding surfaces 41 of the sensor substrate 21 and the circuit substrate 31 are bonded together. In the layered structure, the sensor substrate 21 includes a pixel region 22, and the circuit substrate 31 includes a circuit region 32 configured to process signals detected by the pixel region 22.

Figure 1B:
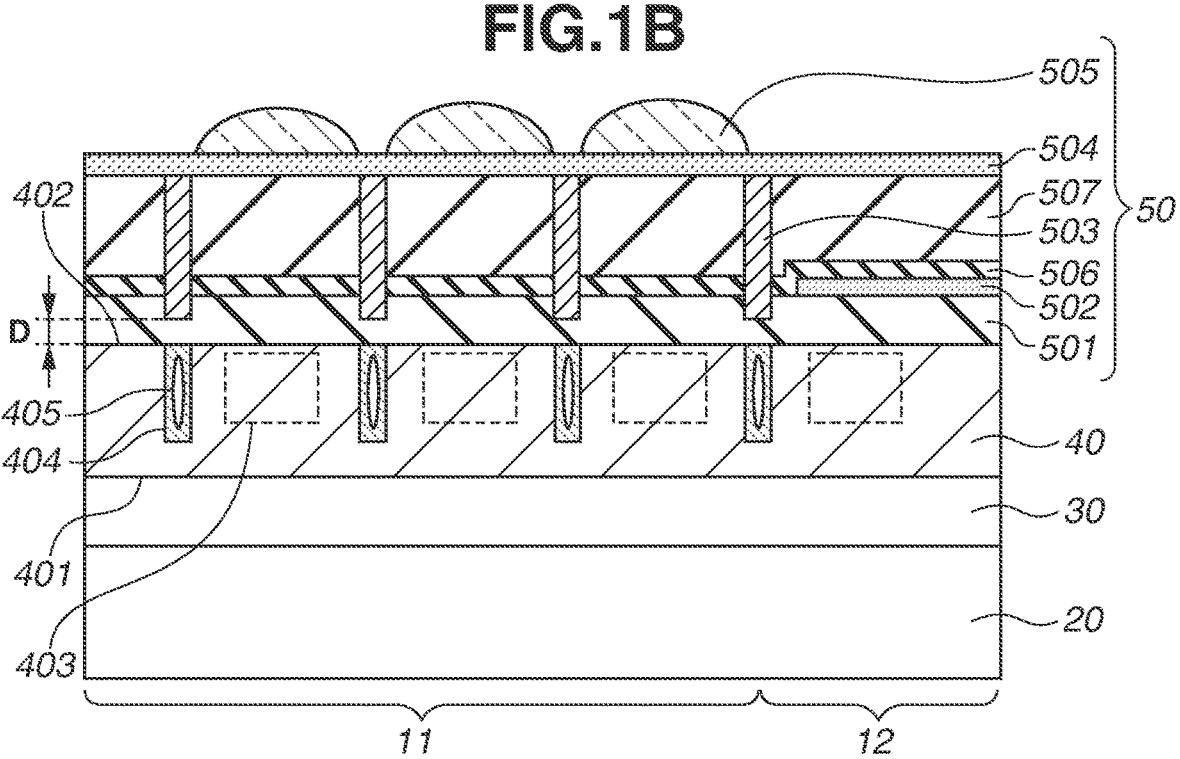

FIG. 1B is a schematic diagram illustrating a cross section of the photoelectric conversion apparatus 10 along a line A-A' in FIG. 1A. The photoelectric conversion apparatus 10 includes a support substrate 20, a wiring structure 30, a semiconductor layer 40, and a back surface structure 50. The semiconductor layer 40 includes a front surface 401 and a back surface 402. The front surface 401 is on the wiring structure 30 side, and the back surface 402 is on the incident light side. While a case where a single pixel includes a single photoelectric conversion portion is illustrated, a single pixel can include a plurality of photoelectric conversion portions.

In the semiconductor layer 40, there is a plurality of photoelectric conversion portions 403 between the front surface 401 and the back surface 402. Examples of a material of the semiconductor layer 40 are monocrystalline silicon and a compound semiconductor.

In the semiconductor layer 40, there is a separation portion 404 formed by a groove continuing from the back surface 402 in a depth direction of the semiconductor layer 40. Each separation portion 404 is formed between the plurality of photoelectric conversion portions 403 to reduce crosstalk between neighboring pixels. A typical material of the separation portion 404 is an insulation film of silicon nitride or silicon oxide but can also be a metal film. In the separation portion 404, there may be a space 405 formed in embedding the separation portion 404. Because the space 405 reflects incident light on neighboring pixels, optical crosstalk may be reduced. There may be a case where the space 405 does not exist.

The back surface structure 50 will be described below. Above the back surface 402 of the semiconductor layer 40, there is a first insulation film 506. The first insulation film 506 can have, for example, a three-layer structure of silicon oxynitride, silicon nitride, and silicon oxynitride, or can be silicon oxide.

Between the first insulation film 506 and the back surface 402, there are a light shielding film 502 and a second insulation film 501. Further, the second insulation film 501 is provided between the light shielding film 502 and the back surface 402. The light shielding film 502 is provided above the light shielding pixel region 12 and prevents light rays from entering a photoelectric conversion portion 403 in the light shielding pixel region 12. The light shielding film 502 can be a metal film containing tungsten or aluminum. The second insulation film 501 can be, for example, a silicon oxide film.

On the first insulation film 506, there is a third insulation film 507. The third insulation film 507 can be a silicon oxide film. Further, on the third insulation film 507, there are a color filter 504 and a microlens 505.

In the first insulation film 506, the second insulation film 501, and the third insulation film 507, there is a light shielding wall 503. The light shielding wall 503 is provided to overlap the separation portion 404 in plan view from the back surface 402 side. The light shielding wall 503 can be a metal film containing tungsten. Light incident on the photoelectric conversion apparatus 10 is reflected by the light shielding wall 503, whereby optical crosstalk to neighboring pixels is prevented. In a case where a light ray enters at a great angle of incidence, however, the incident light may illuminate a neighboring pixel through a space between a lower end (end portion on the back surface 402 side) of the light shielding wall 503 and an upper end (end portion on the back surface 402 side) of the separation portion 404 and may cause optical crosstalk.

In order to prevent the above-described issue, a distance D between the lower end of the light shielding wall 503 and the upper end of the separation portion 404 is desirably small. In a case where the distance D is small, however, since the space 405 may be in the separation portion 404, the lower end of the light shielding wall 503 and an upper end (end portion on the back surface 402 side) of the space 405 may come into contact due to variations in manufacturing. This may cause an issue of contamination of a manufacturing apparatus and is therefore undesirable.

A structure on the front surface 401 side will be described below. A transistor (not illustrated) is on a front surface of the semiconductor layer 40. Under the transistor, there is the wiring structure 30. The wiring structure 30 has a multi-layer wiring structure including a plurality of wiring structures. Under the wiring structure 30, there is the support substrate 20. The support substrate 20 mechanically supports the wiring structure 30, the semiconductor layer 40, and the back surface structure 50.

Figure 3A:
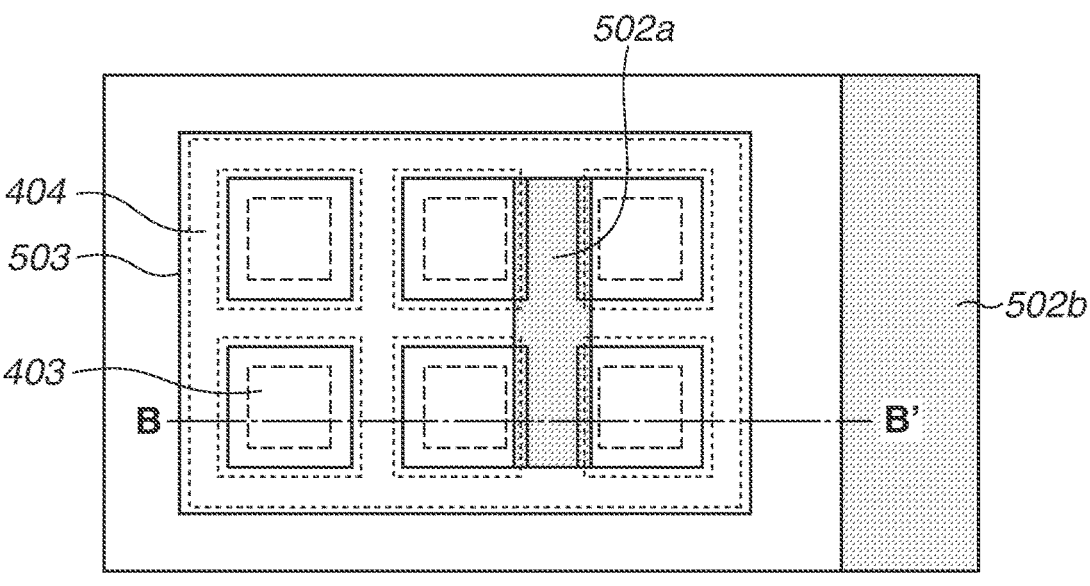
FIGS. 3A and 3B are schematic diagrams illustrating a configuration of a photoelectric conversion apparatus according to a first embodiment.
Figure 3B:
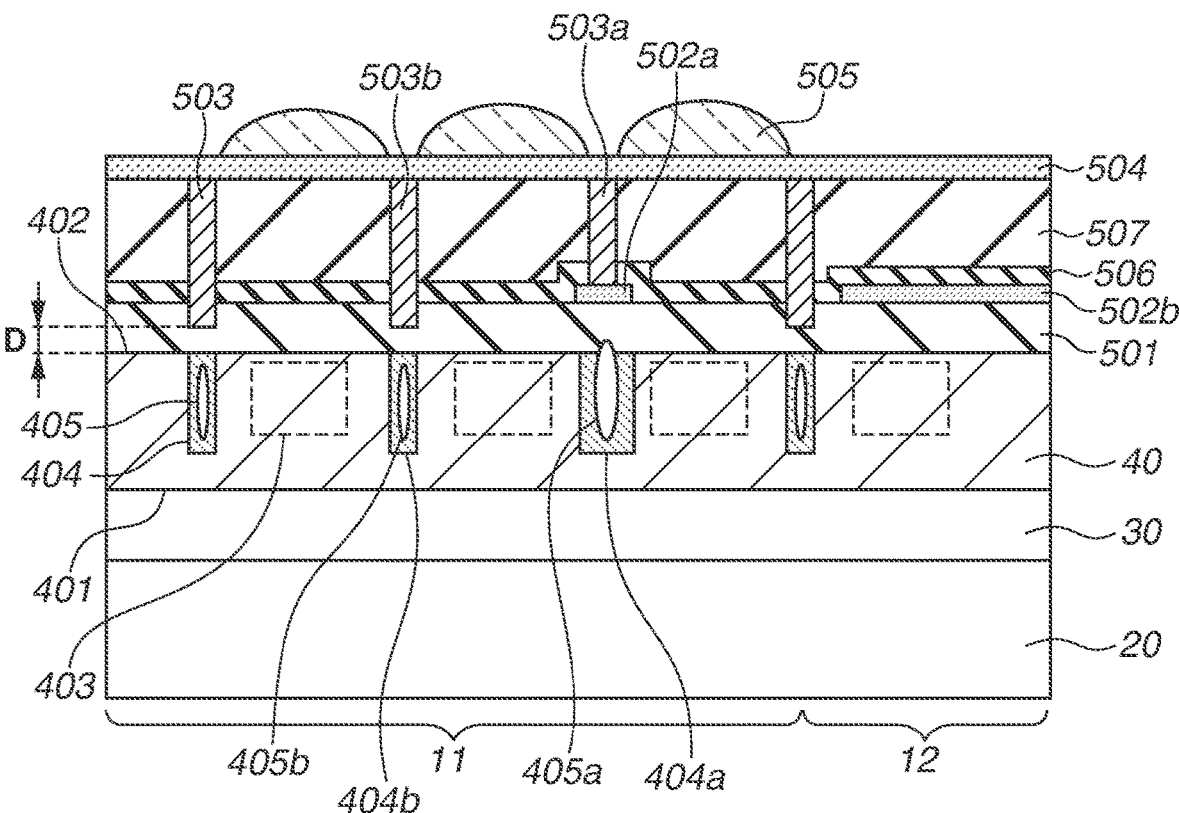

A first embodiment will be described below with reference to FIGS. 3A and 3B. FIG. 3A is a plan view including the photoelectric conversion portions 403 corresponding to six pixels. FIG. 3B is a cross-sectional view along a line B-B' in FIG. 3A. A direction indicated by the line B-B' in FIG. 3A will be referred to as "first direction" according to the first embodiment. The first direction is parallel to the back surface 402. Further, in the first direction, a first light shielding film 502a is provided between first insulation films 506. As understood from FIG. 3A, the light shielding wall 503 and the separation portion 404 are arranged in a grid, and light rays entering through opening portions of the light shielding wall 503 and the separation portion 404 illuminate the photoelectric conversion portion 403, thereby causing photoelectric conversion. Further, the light shielding wall 503 is positioned to overlap the separation portion 404 in plan view from the back surface 402 side. The separation portion 404 can have different widths in a pixel region, and the wider the separation portion 404 is, the further an upper end of the space 405 can extend upward.

As illustrated in FIG. 3B, according to the present embodiment, a first separation portion 404a is greater in width in the first direction than a second separation portion 404b. Further, in the example according to the present embodiment, the first separation portion 404a includes a first space 405a therein, and the second separation portion 404b includes a second space 405b smaller than the first space 405a therein. Further, an upper end of the first space 405a is closer to the first insulation film 506 than the back surface 402 is, and an upper end of the second space 405b is closer to the wiring structure 30 than the back surface 402 is. Further, a first light shielding wall 503a is provided in the first insulation film 506 to overlap the first separation portion 404a in plan view from the back surface 402 side. Further, a second light shielding wall 503b is provided in the first insulation film 506 to overlap the second separation portion 404b in plan view from the back surface 402 side. Furthermore, under a lower portion of the first light shielding wall 503a, which is positioned above the first separation portion 404a, there is the first light shielding film 502a in contact with a lower end of the first light shielding wall 503a. Meanwhile, a lower end of the second light shielding wall 503b, which is provided above the second separation portion 404b, penetrates through the first insulation film 506 and extends into the second insulation film 501. In other words, a distance between an end portion of the first light shielding wall 503a that is on the back surface 402 side and the back surface 402 is greater than a distance between an end portion of the first light shielding film 502a that is on the back surface 402 side and the back surface 402. Furthermore, the distance between the end portion of the first light shielding film 502a that is on the back surface 402 side and the back surface 402 is greater than a distance between an end portion of the second light shielding wall 503b that is on the back surface 402 side and the back surface 402.

The first light shielding film 502a functions as an etching stopper in forming the first light shielding wall 503a and prevents the lower end of the first light shielding wall 503a from coming into contact with the first space 405a in the first separation portion 404a. This simultaneously enables reduction of optical crosstalk under the second light shielding wall 503b and prevention of the lower end of the first light shielding wall 503a from coming into contact with the first space 405a in the first separation portion 404a. Further, in order for the first light shielding film 502a to effectively function as the etching stopper in forming the first light shielding wall 503a, the first light shielding film 502a is desirably greater in width in the first direction than the first light shielding wall 503a. While FIG. 3B illustrates an example where the upper end of the first space 405a is positioned above the back surface 402, the present embodiment is not limited to the example. Further, there may be an example where the second space 405b does not exist.

An example of a method for manufacturing the photoelectric conversion apparatus 10 according to the present embodiment will be described below with reference to FIGS. 4 to 6.

In a process A illustrated in FIG. 4A, a member including the wiring structure 30 and the semiconductor layer 40 is layered on the support substrate 20. The semiconductor layer 40 is processed to have a desired thickness. The thickness of the semiconductor layer 40 is typically about 1 μm to about 5 μm. The semiconductor layer 40 includes the front surface 401 on the wiring structure 30 side and the back surface 402 on the incident light side, and the plurality of photoelectric conversion portions 403 is formed between the front surface 401 and the back surface 402.

In a process B illustrated in FIG. 4B, the separation portion 404 is formed in the semiconductor layer 40. The separation portion 404 can have different widths in a pixel region. In the present embodiment, the second separation portion 404b is smaller in width in the first direction than the first separation portion 404a. Further, while a lower end (end portion on the front surface 401 side) of the separation portion 404 is between the front surface 401 and the back surface 402 in FIG. 4B, the separation portion 404 can be formed to penetrate through the semiconductor layer 40.

In a process C illustrated in FIG. 4C, a dielectric layer (not illustrated), an antireflection film (not illustrated), and the second insulation film 501 are formed on the back surface 402 and the separation portion 404. The dielectric layer can be, for example, aluminum oxide or hafnium oxide. The antireflection film can be, for example, tantalum oxide. The second insulation film 501 can be silicon oxide or silicon nitride. The first separation portion 404a and the second separation portion 404b may respectively include the first space 405a and the second space 405b formed in embedding the second insulation film 501. However, there may be an example where the second space 405b does not exist. In the present example, the upper end of the first space 405a is positioned above the back surface 402 of the semiconductor layer 40, and the upper end of the second space 405b is positioned below the back surface 402 of the semiconductor layer 40. In other words, the upper end of the first space 405a is closer to the first insulation film 506 than the back surface 402 is, and the upper end of the second space 405b is closer to the wiring structure 30 than the back surface 402 is.

Figures 5A, 5B, 5C:
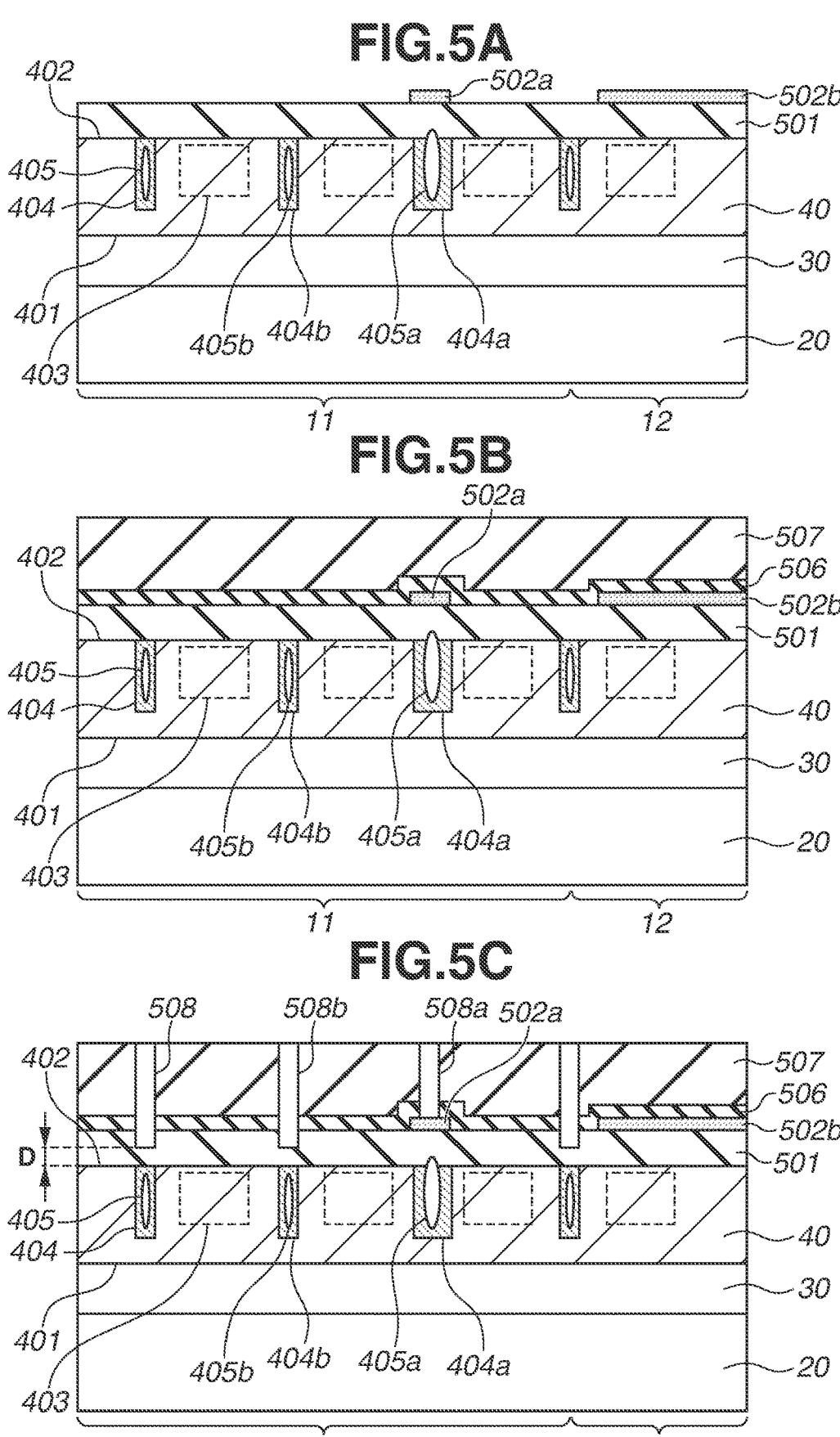
FIGS. 5A, 5B, and 5C are schematic diagrams illustrating a method for manufacturing the photoelectric conversion apparatus illustrated in FIGS. 3A and 3B.

In a process D illustrated in FIG. 5A, the light shielding film 502 is formed on the second insulation film 501. The light shielding film 502 is formed by a metal film formed on the second insulation film 501 and then being etched so that the light shielding film 502 remains only at a desired portion. In the present embodiment, the first light shielding film 502a is provided above the first separation portion 404a, and a second light shielding film 502b is provided above the light shielding pixel region 12. The light shielding film 502 can be, for example, a metal film containing tungsten or aluminum.

In a process E illustrated in FIG. 5B, the first insulation film 506 is formed on the second insulation film 501 and the light shielding film 502, and the third insulation film 507 is formed on the first insulation film 506. The third insulation film 507 is polished after being formed using chemical mechanical polishing to smooth a front surface of the third insulation film 507. The first insulation film 506 can have, for example, a three-layer structure of silicon oxynitride, silicon nitride, and silicon oxynitride, or can be silicon oxide. Further, the third insulation film 507 can be silicon oxide.

In a process F illustrated in FIG. 5C, a hole portion 508 for the light shielding wall 503 is formed in the first insulation film 506, the second insulation film 501, and the third insulation film 507. A lower end (end portion on the back surface 402 side) of a second hole portion 508b for the second light shielding wall 503b above the second separation portion 404b is etched to penetrate through the first insulation film 506 into the second insulation film 501. Further, the distance between the end portion of the first light shielding film 502a that is on the back surface 402 side and the back surface 402 is greater than a distance between an end portion of the second hole portion 508b that is on the back surface 402 side and the back surface 402. At this time, a first hole portion 508a for the first light shielding wall 503a above the first separation portion 404a is also etched at the same time. In order for the first light shielding film 502a to function as the etching stopper, a lower end (end portion on the back surface 402 side) of the first hole portion 508a is formed to be in contact with the first light shielding film 502a. In a case where there is no first light shielding film 502a under the first hole portion 508a, the lower end of the first hole portion 508a penetrates through the first insulation film 506 and extends into the second insulation film 501. At this time, the upper end of the first space 405a in the first separation portion 404a may extend above the back surface 402 of the semiconductor layer 40, so that the lower end of the first hole portion 508a and the upper end of the first space 405a may come into contact with each other. In this case, a chemical solution or etching gas used in forming the light shielding wall 503 may remain in the space 405 and may contaminate the manufacturing apparatus in a subsequent process. In the present embodiment, the first light shielding film 502a is used as the etching stopper for the first hole portion 508a to prevent the above-described issue and contribute to yield improvement. In order for the first light shielding film 502a to effectively function as the etching stopper in forming the first light shielding wall 503a, the first light shielding film 502a is desirably greater in width in the first direction than the first light shielding wall 503a.

Figure 6A:
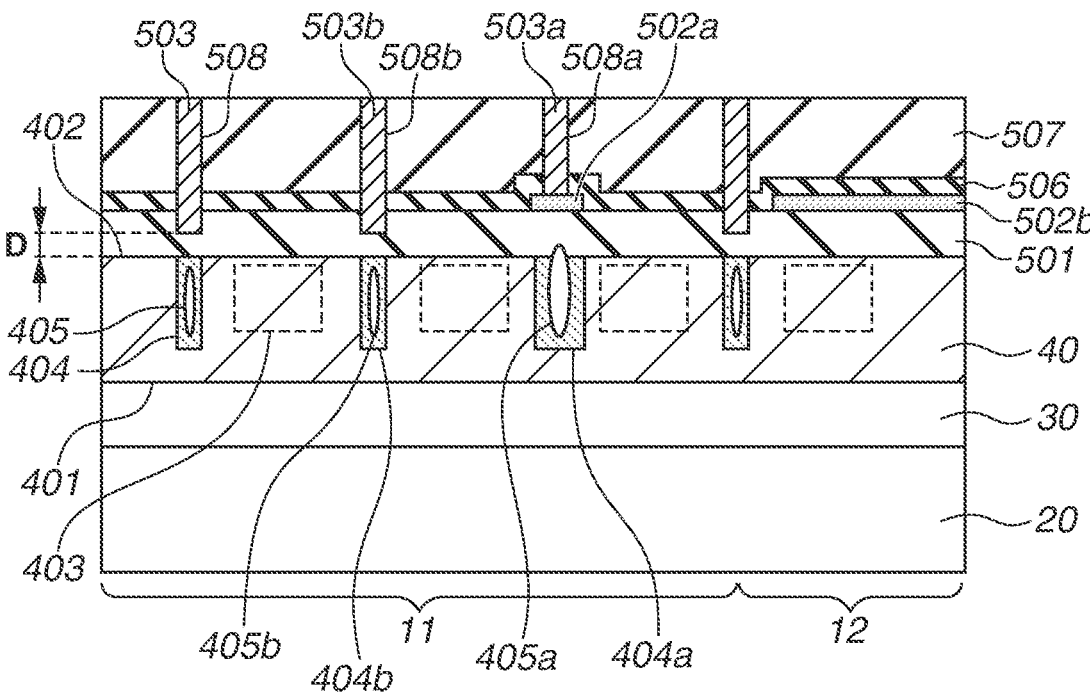
FIGS. 6A and 6B are schematic diagrams illustrating a method for manufacturing the photoelectric conversion apparatus illustrated in FIGS. 3A and 3B.

In a process G illustrated in FIG. 6A, the light shielding wall 503 is formed by a light shielding material film formed in the hole portion 508 for the light shielding wall 503 and then unwanted portions thereof being removed by chemical mechanical polishing.

The light shielding material film can be a metal film containing tungsten.

Figure 6B:
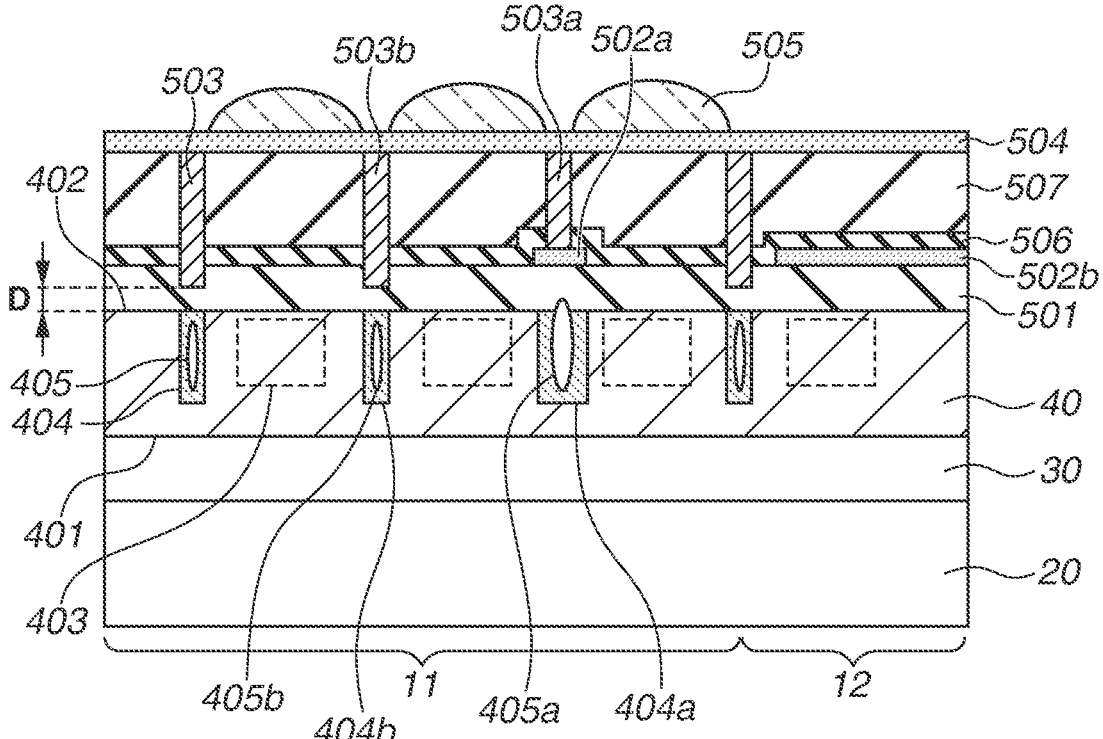

In a process H illustrated in FIG. 6B, the color filter 504 is formed on the third insulation film 507, and the microlens 505 is formed on the color filter 504.

The photoelectric conversion apparatus 10 according to the present embodiment is manufactured by the foregoing manufacturing method including the etching process of forming the first hole portion 508a and the second hole portion 508b.

While the example where the single separation portion 404 includes a single space has been described in the present embodiment, the present embodiment is not limited to the example. For example, another space can be formed under the first space 405a separately from the first space 405a. Further, the second space 405b may not be formed. Still further, another space can be formed in the separation portion 404b where the second space 405b is formed.

Figure 7A:
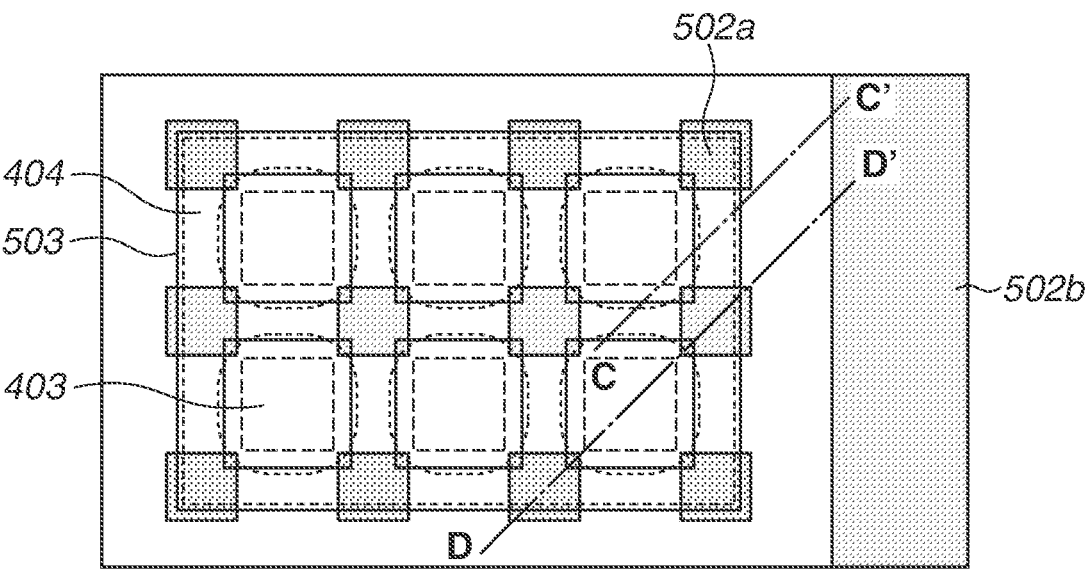
FIGS. 7A, 7B, and 7C are schematic diagrams illustrating a configuration of a photoelectric conversion apparatus according to a second embodiment.
Figures 7B, 7C:
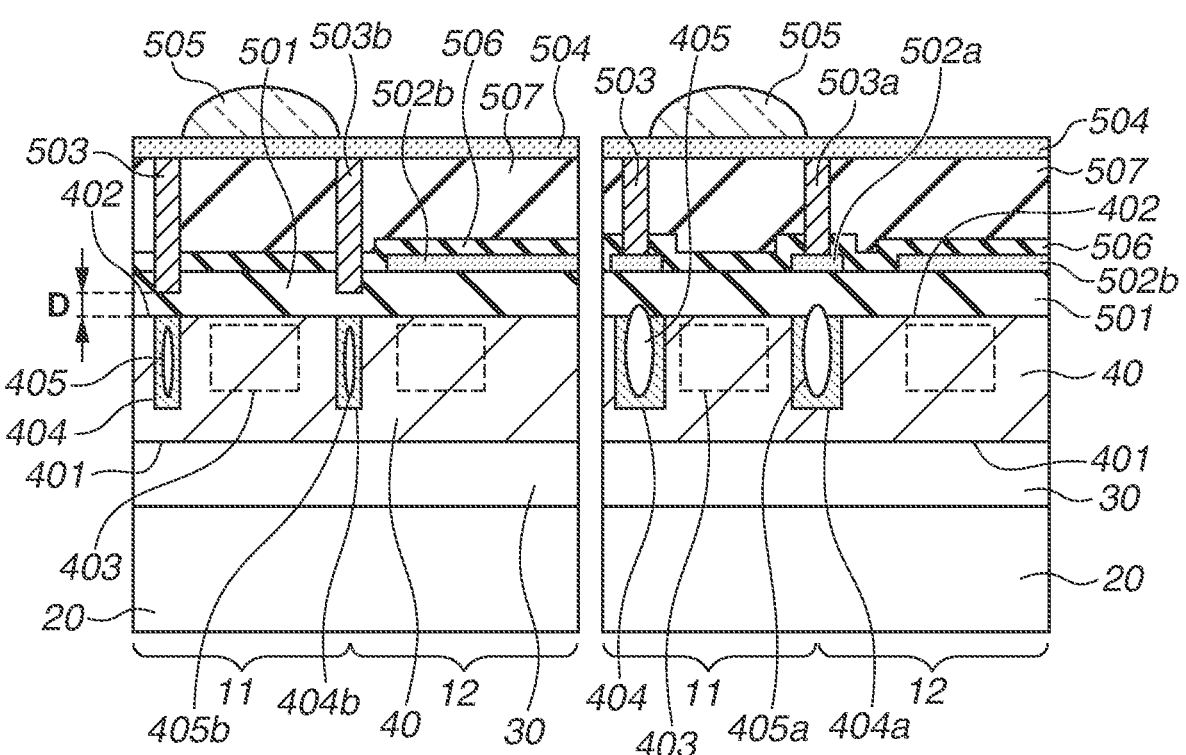

A second embodiment will be described below with reference to FIGS. 7A, 7B, and 7C. FIG. 7A is a plan view illustrating the photoelectric conversion portion 403 corresponding to six pixels. FIG. 7B is a cross-sectional view along a line C-C' in FIG. 7A, and FIG. 7C is a cross-sectional view along a D-D' in FIG. 7A. The lines C-C' and D-D' in FIG. 7A are parallel to each other, and a direction specified by the lines C-C' and D-D' will be referred to as a "first direction" according to the second embodiment. The first direction is parallel to the back surface 402. For example, a portion where light shielding walls 503 intersect will be referred to as a "cross portion" of the light shielding wall 503, and a portion where the light shielding walls 503 do not intersect will be referred to as a "line portion" of the light shielding wall 503. Further, the cross portion and the line portion are also applicable to a component other than the light shielding walls 503. For example, the cross portion and the line portion are applicable to the separation portion 404. Further, a component similar to its corresponding component according to the first embodiment is given the same reference numeral as that in the first embodiment, and a description thereof is sometimes omitted or simplified. Further, a structure according to the second embodiment can be manufactured by a manufacturing method similar to the above-described manufacturing method according to the first embodiment.

As understood from FIGS. 7A and 7B, the second light shielding wall 503b and the second separation portion 404b are respectively provided at the line portion of the light shielding wall 503 and the line portion of the separation portion 404, and the lower end of the second light shielding wall 503b penetrates through the first insulation film 506 into the second insulation film 501. Meanwhile, as illustrated in FIGS. 7A and 7C, the first light shielding wall 503a and the first separation portion 404a are respectively provided at the cross portion of the light shielding wall 503 and the cross portion of the separation portion 404, and the first light shielding film 502a is provided under the first light shielding wall 503a and is in contact with the first light shielding wall 503a. Further, the distance between the end portion of the first light shielding wall 503a that is on the back surface 402 side and the back surface 402 is greater than the distance between the end portion of the first light shielding film 502a that is on the back surface 402 side and the back surface 402. Furthermore, the distance between the end portion of the first light shielding film 502a that is on the back surface 402 side and the back surface 402 is greater than the distance between the end portion of the second light shielding wall 503b that is on the back surface 402 side and the back surface 402. In the example, the first separation portion 404a corresponds to a cross portion of the second separation portion 404b.

The second separation portion 404b is smaller in width in the first direction than the first separation portion 404a. Thus, the upper end of the second space 405b at the line portion of the separation portion 404 may be positioned below the upper end of the first space 405a at the cross portion of the separation portion 404. Thus, at the line portion of the separation portion 404, the distance D between the lower end of the second light shielding wall 503b and an upper end of the second separation portion 404b can be reduced without the lower end of the second light shielding wall 503b being in contact with the second space 405b in the second separation portion 404b. At the cross portion of the separation portion 404, on the other hand, the lower end of the first light shielding wall 503a and the upper end of the first space 405a may come into contact with each other. In the present embodiment, however, the first light shielding film 502a is provided above the cross portion of the separation portion 404 and thus prevents the lower end of the first light shielding wall 503a from coming into contact with the first space 405a.

In the present embodiment, the distance D between the lower end of the second light shielding wall 503*b* and the upper end of the second separation portion 404*b* is reduced to reduce crosstalk at the line portion while the lower end of the first light shielding wall 503*a* and the first space 405*a* are prevented from coming into contact with each other at the cross portion.

Further, in order for the first light shielding film 502*a* to effectively function as the etching stopper in forming the first light shielding wall 503*a*, the first light shielding film 502*a* is desirably greater in width in the first direction than the first light shielding wall 503*a*. While FIG. 7C illustrates an example where the upper end of the first space 405*a* is above the back surface 402, the present embodiment is not limited to the example. Further, there may be an example where the second space 405*b* does not exist.

Figure 8A:
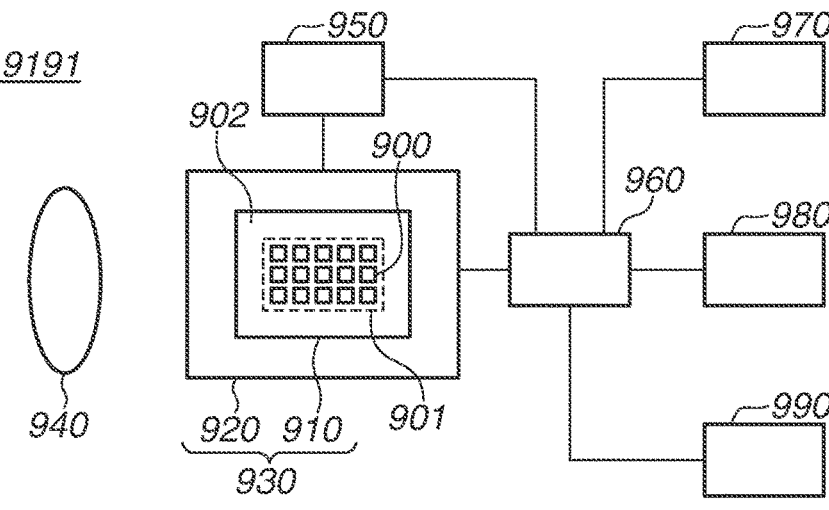
FIGS. 8A, 8B, and 8C are schematic diagrams illustrating a configuration of equipment according to a third embodiment.

A third embodiment is applicable to either of the first and second embodiments. FIG. 8A is a schematic diagram illustrating equipment 9191 including a semiconductor apparatus 930 according to the present embodiment. A photoelectric conversion apparatus (imaging apparatus) according to any one of the above-described embodiments can be used as the semiconductor apparatus 930. The equipment 9191 including the semiconductor apparatus 930 will be described in detail below. The semiconductor apparatus 930 can include a semiconductor device 910 as well as a package 920 for storing the semiconductor device 910. The package 920 can include a base member to which the semiconductor device 910 is fixed and a cover member made of glass or the like facing the semiconductor device 910. The package 920 can further include a bonding member such as a bonding wire and a bump for connecting a terminal provided to the base member and a terminal provided to the semiconductor device 910.

The equipment 9191 can include at least one of an optical apparatus 940, a control apparatus 950, a processing apparatus 960, a display apparatus 970, a storage apparatus 980, and a mechanical apparatus 990. The optical apparatus 940 corresponds to the semiconductor apparatus 930. The optical apparatus 940 is, for example, a lens, a shutter, and a mirror and includes an optical system for guiding light to the semiconductor apparatus 930. The control apparatus 950 controls the semiconductor apparatus 930. The control apparatus 950 is, for example, a semiconductor apparatus such as an application-specific integrated circuit (ASIC).

The processing apparatus 960 processes signals output from the semiconductor apparatus 930. The processing apparatus 960 is a semiconductor apparatus such as a central processing unit (CPU) or an ASIC that constitutes an analog front-end (AFE) or a digital front-end (DFE). The display apparatus 970 is an electroluminescent (EL) display apparatus or a liquid crystal display apparatus and displays information (image) acquired by the semiconductor apparatus 930. The storage apparatus 980 is a magnetic device or a semiconductor device that stores information (image) acquired by the semiconductor apparatus 930. The storage apparatus 980 is a volatile memory such as a static random access memory (SRAM) or a dynamic random access memory (DRAM), or a non-volatile memory such as a flash memory or a hard disk drive.

The mechanical apparatus 990 includes a movable unit or a driving unit such as a motor or an engine. The equipment 9191 displays signals output from the semiconductor apparatus 930 on the display apparatus 970 and/or externally transmits the signals via a communication apparatus (not illustrated) of the equipment 9191. Thus, the equipment 9191 desirably includes the storage apparatus 980 and the processing apparatus 960 separately from a storage circuit and a calculation circuit of the semiconductor apparatus 930. The mechanical apparatus 990 can be controlled based on signals output from the semiconductor apparatus 930.

The equipment 9191 is suitable for electronic equipment such as information terminals with an imaging function (e.g., smartphones, wearable terminals) and cameras (e.g., interchangeable-lens cameras, compact cameras, video cameras, monitoring cameras). The mechanical apparatus 990 in a camera can drive parts of the optical apparatus 940 for zooming, focusing, and shutter operations. Further, the mechanical apparatus 990 in a camera can move the semiconductor apparatus 930 for anti-vibration operations.

Further, the equipment 9191 can be transport equipment such as a vehicle, a ship, and an aircraft. The mechanical apparatus 990 in the transport equipment can be used as a moving apparatus. The equipment 9191 as the transport equipment is suitable for transporting the semiconductor apparatus 930 or assisting in and/or automating driving (operation) using the imaging function. The processing apparatus 960 for assisting in and/or automating driving (operation) can perform processing for operating the mechanical apparatus 990 as the moving apparatus based on information acquired by the semiconductor apparatus 930. Further, the equipment 9191 can be medical equipment such as an endoscope, measurement equipment such as a distance measurement sensor, analysis equipment such as an electronic microscope, office equipment such as a copy machine, or industrial equipment such as a robot.

With the above-described embodiments, it is possible to obtain suitable pixel characteristics. Thus, the value of the semiconductor apparatus is increased. Increasing the value herein corresponds to at least one of adding a function, improving performance, improving a characteristic, improving reliability, improving a manufacturing yield, reducing an environmental load, reducing costs, reducing size, and reducing weight.

Thus, use of the semiconductor apparatus 930 according to the present embodiment in the equipment 9191 improves the value of the equipment 9191. For example, the semiconductor apparatus 930 is mounted on transport equipment to achieve excellent performance in imaging the outside of the transport equipment or in measuring an external environment of the transport equipment. Thus, determining to mount the semiconductor apparatus 930 according to the present embodiment on the transport equipment in manufacturing and selling of the transport equipment is advantageous in improving performance of the transport equipment. The semiconductor apparatus 930 is particularly suitable for transport equipment that uses information acquired by a semiconductor apparatus to assist in driving of the transport equipment and/or perform automated driving of the transport equipment.

A photoelectric conversion system and a moving object according to the present embodiment will be described below with reference to FIGS. 8B and 8C.

Figure 8B:
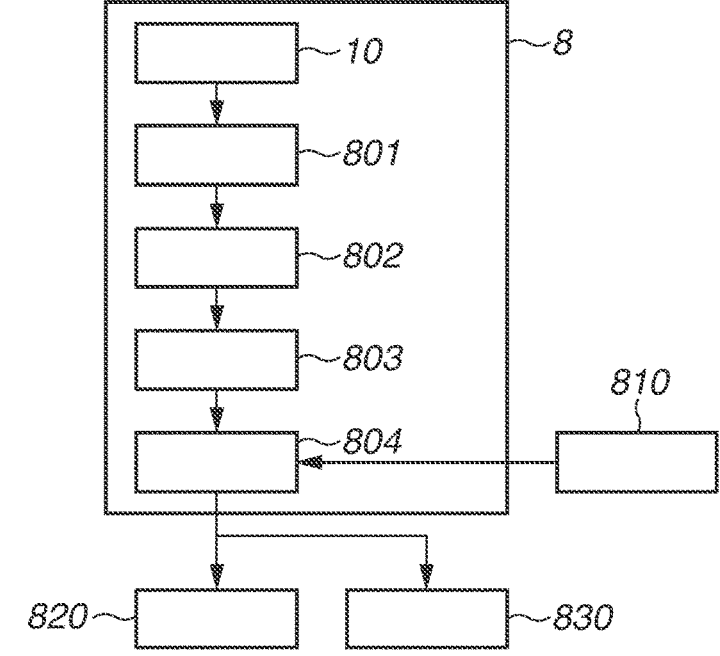

FIG. 8B illustrates an example of a photoelectric conversion system relating to an on-vehicle camera. A photoelectric conversion system 8 includes the photoelectric conversion apparatus 10. The photoelectric conversion apparatus 10 is the photoelectric conversion apparatus (imaging apparatus) according to any one of the above-described embodiments. The photoelectric conversion system 8 includes an image processing unit 801 and a parallax acquisition unit 802. The image processing unit 801 performs image processing on a plurality of pieces of image data acquired by the photoelectric conversion apparatus 10. The parallax acquisition unit 802 calculates a parallax (phase difference between parallax images) from a plurality of pieces of image data acquired by the photoelectric conversion system 8. Further, the photoelectric conversion system 8 includes a distance acquisition unit 803 and a collision determination unit 804. The distance acquisition unit 803 calculates a distance to a target object based on the calculated parallax. The collision determination unit 804 determines whether there is a possibility of a collision based on the calculated distance. The parallax acquisition unit 802 and the distance acquisition unit 803 herein are examples of a distance information acquisition unit for acquiring distance information to a target object. Specifically, the distance information refers to parallax information, defocus amount information, and information about a distance to a target object. The collision determination unit 804 can determine the possibility of a collision based on any one of the above-described distance information. The distance information acquisition unit can be implemented by specially-designed hardware or by a software module. Further, the distance information acquisition unit can be implemented by a field programmable gate array (FPGA) or an ASIC, or by a combination thereof.

The photoelectric conversion system 8 is connected to a vehicle information acquisition apparatus 810 and can acquire vehicle information such as a velocity, a yaw rate, and a rudder angle. Further, the photoelectric conversion system 8 is connected to an electronic control unit (ECU) 820. The ECU 820 is a control apparatus that outputs a control signal to cause the vehicle to generate a braking force based on a result of determination by the collision determination unit 804. The photoelectric conversion system 8 is also connected to a warning apparatus 830. The warning apparatus 830 provides a warning to a driver based on a result of the determination by the collision determination unit 804. For example, in a case where the result of the determination by the collision determination unit 804 indicates that there is a high possibility of a collision, the ECU 820 performs vehicle control to avoid the collision and reduce damage by applying a brake, releasing an accelerator, and reducing engine output. The warning apparatus 830 provides a warning to the user by, for example, producing a warning sound (alarm), displaying warning information on a screen of a car navigation system, or vibrating a safety belt or a steering.

In the present embodiment, the photoelectric conversion system 8 images an area near the vehicle, e.g., the front or the rear.

Figure 8C:
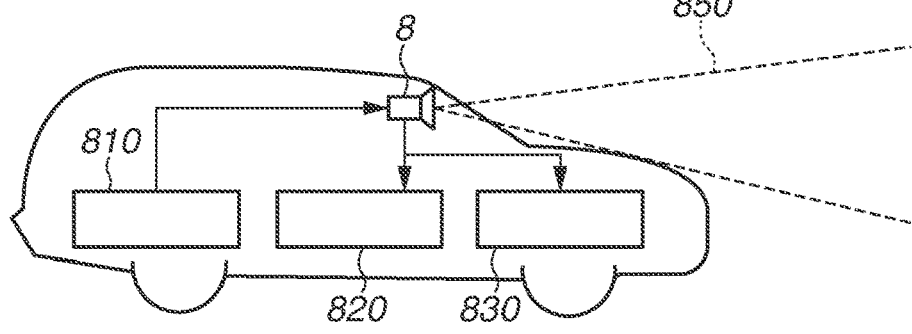

FIG. 8C illustrates the photoelectric conversion system 8 in a case where the front of the vehicle (an imaging range 850) is to be imaged. The vehicle information acquisition apparatus 810 transmits an instruction to the photoelectric conversion system 8 or the photoelectric conversion apparatus 10. With the above-described configuration, distance measurement accuracy is further improved.

While the photoelectric conversion system 8 performs control to avoid a collision with another vehicle in the above-described example, the photoelectric conversion system 8 is also applicable to control of automated driving to follow another vehicle or control of automated driving to avoid lane departure. Furthermore, the photoelectric conversion system 8 is applicable to not only the vehicle but also a moving object (moving apparatus) such as a ship, an aircraft, or an industrial robot. Furthermore, the photoelectric conversion system 8 is also applicable to not only the moving object but also equipment that widely uses object recognition such as an intelligent transport system (ITS).

The above-described embodiments can be changed as appropriate within the technical concept. The disclosure of the present specification is not limited to what is described in the present specification and includes all items that can be understood from the present specification and the drawings attached to the present specification. Further, the disclosure of the present specification includes the complement of the concept described in the present specification. Specifically, in a case where the present specification includes, for example, a phrase "A is greater than B", it is understood that the present specification also discloses a case where "A is not greater than B" even if the phrase "A is not greater than B" is omitted because it is presumed that the case where "A is not greater than B" is considered in a case where the present specification includes the phrase "A is greater than B".

The present disclosure provides a photoelectric conversion apparatus that reduces crosstalk and contamination during manufacturing processes.

While the present disclosure has been described with reference to embodiments, it is to be understood that the disclosure is not limited to the disclosed embodiments. The scope of the following claims is to be accorded the broadest interpretation so as to encompass all such modifications and equivalent structures and functions.

This application claims the benefit of Japanese Patent Applications No. 2022-038231, filed Mar. 11, 2022, and No. 2023-012107, filed Jan. 30, 2023, which are hereby incorporated by reference herein in their entirety.

What is claimed is:

1. A photoelectric conversion apparatus comprising:
a semiconductor layer including a front surface, a back surface, and a plurality of photoelectric conversion portions between the front surface and the back surface;
a wiring structure on the front surface side of the semiconductor layer;
a first insulation film on a back surface side of the semiconductor layer;
a light shielding film between the first insulation film and the back surface;
a first separation portion between two of the plurality of photoelectric conversion portions;
a second separation portion between another two of the plurality of photoelectric conversion portions, the second separation portion being smaller in width in a first direction, parallel to the back surface, than the first separation portion;
a first space in the first separation portion;
a first light shielding wall in the first insulation film, the first light shielding wall overlapping the first separation portion in plan view from the back surface side; and
a second light shielding wall in the first insulation film, the second light shielding wall overlapping the second separation portion in plan view from the back surface side,
wherein an end portion of the first light shielding wall that is on the back surface side is in contact with the light shielding film, and
wherein a distance between an end portion of the light shielding film that is on the back surface side and the back surface is greater than a distance between an end portion of the second light shielding wall that is on the back surface side and the back surface.

2. The photoelectric conversion apparatus according to claim 1, wherein a distance of an end portion of the first space, that is on the back surface side, to the first insulation film is less than a distance of the back surface to the first insulation film.

3. The photoelectric conversion apparatus according to claim 1, wherein a distance of an end portion of a second space in the second separation portion, that is on the back surface side, to the wiring structure is less than a distance of the back surface to the wiring structure.

4. The photoelectric conversion apparatus according to claim 1, wherein the first separation portion corresponds to a cross portion of the second separation portion, in plan view, from the back surface side.

5. The photoelectric conversion apparatus according to claim 1, wherein the light shielding film is greater in width in the first direction than the first light shielding wall.

6. The photoelectric conversion apparatus according to claim 1, wherein a second insulation film is provided between the light shielding film and the back surface.

7. The photoelectric conversion apparatus according to claim 6, wherein an end portion of the second light shielding wall that is on the back surface side is provided in the second insulation film.

8. The photoelectric conversion apparatus according to claim 1, wherein the first separation portion and the second separation portion are formed by a groove continuing from the back surface in a depth direction of a semiconductor.

9. The photoelectric conversion apparatus according to claim 1, wherein the light shielding film contains tungsten or aluminum, and the first light shielding wall and the second light shielding wall contain tungsten.

10. Equipment comprising the photoelectric conversion apparatus according to claim 1, the equipment further comprising at least one of:

an optical apparatus configured to guide light to the photoelectric conversion apparatus;

a control apparatus configured to control the photoelectric conversion apparatus;

a processing apparatus configured to process a signal output from the photoelectric conversion apparatus;

a display apparatus configured to display information acquired by the photoelectric conversion apparatus;

a storage apparatus configured to store the information acquired by the photoelectric conversion apparatus; and a mechanical apparatus configured to operate based on the information acquired by the photoelectric conversion apparatus.

11. A substrate comprising:

a semiconductor layer including a front surface, a back surface, and a plurality of photoelectric conversion portions between the front surface and the back surface;

a wiring structure on the front surface side of the semiconductor layer;

a first insulation film on a back surface side of the semiconductor layer;

a light shielding film between the first insulation film and the back surface;

a first separation portion between two of the plurality of photoelectric conversion portions;

a second separation portion between another two of the plurality of photoelectric conversion portions, the second separation portion being smaller in width in a first direction, parallel to the back surface, than the first separation portion;

a first space in the first separation portion;

a first light shielding wall in the first insulation film, the first light shielding wall overlapping the first separation portion in plan view from the back surface side; and a second light shielding wall in the first insulation film, the second light shielding wall overlapping the second separation portion in plan view from the back surface side, wherein an end portion of the first light shielding wall that is on the back surface side is in contact with the light shielding film, and wherein a distance between an end portion of the light shielding film that is on the back surface side and the back surface is greater than a distance between an end portion of the second light shielding wall that is on the back surface side and the back surface.

12. The substrate according to claim 11, wherein an end portion of the first space that is on the back surface side is closer to the first insulation film than the back surface is, and an end portion of a second space in the second separation portion that is on the back surface side is closer to the wiring structure than the back surface is.

13. The substrate according to claim 11, wherein the first separation portion corresponds to a cross portion of the second separation portion, in plan view, from the back surface side.

14. The substrate according to claim 11, wherein the light shielding film is greater in width in the first direction than the first light shielding wall.

15. The substrate according to claim 11, further comprising a bonding surface to a circuit substrate.

\* \* \* \* \*